United States Patent
Imai et al.

(10) Patent No.: US 8,638,610 B2
(45) Date of Patent: Jan. 28, 2014

(54) SEMICONDUCTOR STORAGE DEVICE

(75) Inventors: Takeharu Imai, Kyoto (JP); Hiroki Takagi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 32 days.

(21) Appl. No.: 13/367,420

(22) Filed: Feb. 7, 2012

(65) Prior Publication Data

US 2012/0201081 A1 Aug. 9, 2012

(30) Foreign Application Priority Data

Feb. 7, 2011 (JP) ................................. 2011-023754

(51) Int. Cl.
*G11C 11/34* (2006.01)
(52) U.S. Cl.
USPC ................................. 365/185.18; 365/185.24
(58) Field of Classification Search
USPC ........................................ 365/185.18, 185.24
See application file for complete search history.

(56) References Cited

U.S. PATENT DOCUMENTS

| 7,816,891 | B2* | 10/2010 | Nebrigic et al. | 320/136 |
| 2007/0206412 | A1 | 9/2007 | Masago et al. | |
| 2008/0143401 | A1* | 6/2008 | Rai et al. | 327/157 |
| 2012/0327726 | A1* | 12/2012 | Tsern et al. | 365/189.11 |

FOREIGN PATENT DOCUMENTS

| JP | 2007234776 | 9/2007 |
| WO | 2005/062311 | 7/2005 |

* cited by examiner

*Primary Examiner* — Michael Tran
(74) *Attorney, Agent, or Firm* — Fish & Richardson P.C.

(57) ABSTRACT

The invention provides a semiconductor storage device which can restrain the uneven high voltage applied to the storage unit and can provide the high voltage with high precision. The semiconductor storage device includes a storage unit array, a Y decoder circuit, a X decoder circuit, a sense amplifier circuit, a Y gate circuit, a high voltage generating circuit, a high voltage regulator circuit, and a voltage adjusting circuit. The voltage modifying data for adjusting the potential of the anode of the zener diode so as to adjust the high voltage applied to the storage unit array is written into the storage unit array. The voltage modifying data is used to adjust voltage by the voltage adjusting circuit.

19 Claims, 6 Drawing Sheets

| tested VPP | data written in voltage modifying storage unit |
|---|---|
| 16.60V – 16.95V | 80 |
| 16.95V – 17.55V | 20 |
| 17.55V – 17.65V | C0 |
| 17.65V – 18.30V | A0 |
| 18.30V – 19.00V | E0 |

SEMICONDUCTOR STORAGE DEVICE

BACKGROUND OF THE INVENTION

1. Field of the Invention

The present invention relates to a semiconductor storage device including a high voltage regulator circuit used in a storage device that needs a high voltage when data in an electrically rewritable memory is erased or is written.

2. Description of the Related Art

EEPROM (Electrically Erasable Programmable Read Only Memory) and flash memory are widely used in various program storage or data storage in commercialized equipment and industrial equipment. The storage unit in EEPROM or flash memory generates tunnel current or thermal electron, by using high voltage (e.g. 15V), to inject electron on the floating gate or emit electron of the floating gate. As a result, the threshold value of the storage unit changes to rewrite data (referring to Patent documents 1 and 2).

FIG. 8 is a block diagram showing a conventional semiconductor storage device. The conventional semiconductor storage device includes a high voltage input/output circuit 61, a high voltage generating circuit 62, a high voltage regulator circuit 90, a X decoder 71, a Y decoder 70 and a storage unit array 72. The storage unit array 72 includes a plurality of storage units arranged in two dimensions. The storage unit array 72 is connected to: the X decoder 71 for inputting address signal of high bit address line and for selecting word line of the storage unit array 72; the Y decoder 70 for inputting address signal of low bit address line and for selecting readout or rewrite-into fixed storage unit within storage unit connected to a word line; and the Y gate 73 for reading data of the selected storage unit and outputting to data line or transmitting data signal of the data line to the storage unit array 72.

Moreover, the semiconductor storage device includes: the high voltage generating circuit 62 for generating a high voltage VPP when rewriting data and outputting to the X decoder 71 and the Y decoder 70; and the high voltage regulator circuit 90 for controlling the high voltage form the high voltage generating circuit 62 to be a fixed voltage. When data is rewritten into the storage unit array, the high voltage generating circuit 62 generates the high voltage needed to erase/write, and the high voltage is applied to the storage unit of the storage unit array 72 through the X decoder 71 and the Y decoder 70.

During the period of erasing/writing data of the storage unit, the storage unit of the storage unit array 72 is applied with the fixed voltage on a fixed period. By the above operation, the storage unit is erased/written. However, if the applied voltage is higher than the rated voltage, the transistor of the storage unit is applied with the high voltage and will be damaged. On the other hand, if the applied voltage is lower than the rated voltage, the threshold voltage of the transistor of the storage unit can not be changed sufficiently.

Therefore, the high voltage regulator circuit 90 is mounted to maintain the applied high voltage to be the fixed voltage. The high voltage regulator circuit 90 includes a plurality of FETs (Field effect Transistor) 63, 65, 66, 67, a zener diode 64, a constant current source 68 and a buffer 69. The withstand voltage of the zener diode 64 is selected to be the same level as the high voltage for rewriting data used in the storage unit.

The EN (enable) signal is input to the gate of the FET 65 so as to operate the high voltage regulator circuit 90. On the other hand, if the output voltage VPP from the high voltage generating circuit 62 changes and is higher than a reference value, the zener diode 64 turns on and a current flows through the FET 63, the zener diode 64, the FET 65 and the FET 66. A bias voltage is applied to the FET 67, thus the FET 67 turns on and a current flows through the FET 67. Therefore, the input side of the buffer 69 turns to low voltage level, and the output side of the buffer 69 turns to low voltage level, the high voltage generating EN (enable) signal becomes low voltage level so as to stop the operation of the high voltage generating circuit 62.

During the period of stopping the operation of the high voltage generating circuit 62, since the current flows through the zener diode 64, the high voltage VPP is decreased. When the high voltage VPP is lower than the withstand voltage of the zener diode 64, no current flows through the zener diode 64 and the output side of the buffer 69 turns to high voltage level so that the high voltage generating circuit 62 operates again. The above method is used to maintain the high voltage to be the fixed voltage.

Additionally, in the die sort test for the semiconductor storage device on die stage, the voltage level of various output voltage from the high voltage generating circuit used in the semiconductor storage device is tested whether the voltage level is the same as a predetermined value and whether the voltage level can perform the basic writing or erasing operation. To proceed the voltage test on die stage, a plurality of solder pads are mounted to connect external terminal. One of the solder pads is the testing solder pad shown in FIG. 8.

Patent document 1: Japanese Patent Publication No. 2007-234776.

Patent document 2: WO 2005/062311.

SUMMARY OF THE INVENTION

However, in the conventional high voltage regulator circuit, sometimes the withstand voltage of the zener diode is not uniform. When erasing or rewriting data, it is possible that the output voltage from the high voltage generating circuit is not uniform so as to degrade the storage unit or to cause misoperation. Moreover, when the test is confirmed before the goods is delivered, it is the reason of low production efficiency that the good is determined to be a disqualified good because of the deviation of the high voltage.

In view of solving the foregoing problems, the objective of the present invention lies in providing a semiconductor storage device which can restrain the uneven high voltage applied to the storage unit and provide the high voltage with high precision.

In order to achieve the foregoing objective, the semiconductor storage device according to the present invention includes: a high voltage generating circuit, for providing a high voltage to a memory; a high voltage regulator circuit, for maintaining the high voltage form the high voltage generating circuit to be a fixed voltage, and comprising a voltage setting element; a voltage adjusting circuit, for adjusting a potential of the voltage setting element and adjusting the high voltage provided to the memory, and a storage portion, for storing voltage modifying data provided to the voltage adjusting circuit.

EFFECTS OF THE INVENTION

According to the invention, based on the voltage modifying data stored in the storage portion, for the high voltage form the high voltage generating circuit, the voltage adjusting circuit is used to adjusting the potential of the voltage setting element, thus the precision of the high voltage provided to the memory is increased. Moreover, for the die of semiconductor storage device with large voltage deviation, the disqualified die in the test before the goods is delivered can proceed the voltage modification so as to be within the tolerance interval, thus the disqualified die can be determined as a qualified die to increase the yield rate. Additionally, since the precision of the voltage is increased, the life-span of the semiconductor storage device is increased.

PREFERRED EMBODIMENT OF THE INVENTION

Figure 1:
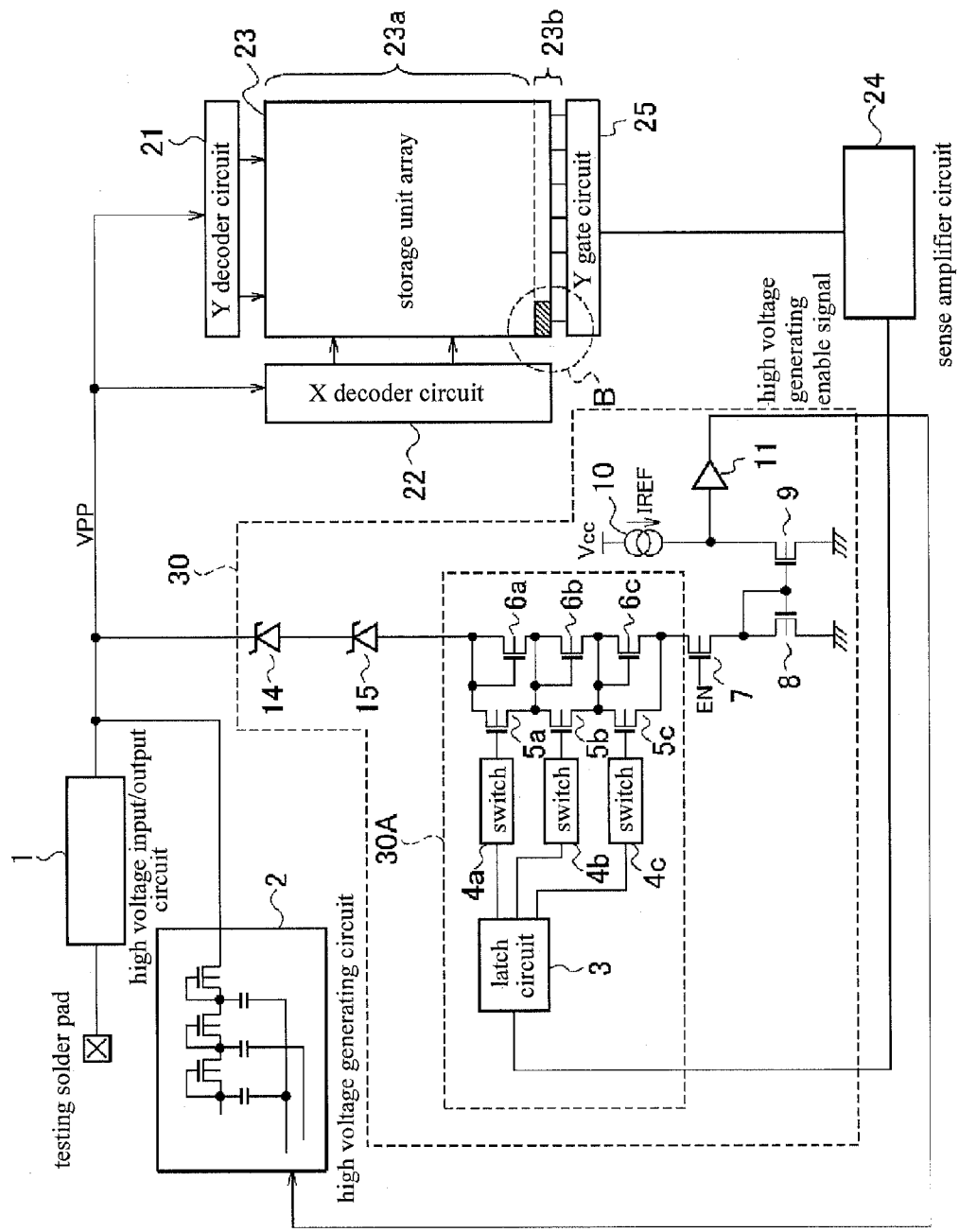
FIG. 1 is a block diagram showing a semiconductor storage device according to an embodiment of the present invention.

One embodiment of the present invention is described in detail below with reference to the accompanying drawings. In the following description, common reference numerals are used throughout the drawings and the detailed description to indicate the same elements. Concerning the constructional drawings being schematic drawings, sometimes the drawings include size relation or different rate each other.

FIG. 1 is a block diagram showing a semiconductor storage device according to an embodiment of the present invention. Reference numeral 23 is a storage unit array, reference numeral 21 is a Y decoder circuit, reference numeral 22 is a X decoder circuit, reference numeral 24 is a sense amplifier circuit, reference numeral 25 is a Y gate circuit, reference numeral 1 is a high voltage input/output circuit, reference numeral 2 is a high voltage generating circuit, reference numeral 30 is a high voltage regulator circuit, and reference numeral 30A is a voltage adjusting circuit. The output signal of the sense amplifier circuit 24 is input to the high voltage regulator circuit 30. The high voltage generating circuit 2 can include charge pump circuit having capacitors and FETs.

The high voltage regulator circuit 30 includes the voltage adjusting circuit 30A, a zener diode 14 as a voltage setting element, a zener diode 15 as a voltage setting element, a FET 7, a FET 8, a FET 9, a constant current source 10 and an invertor 11. These FETs are N type MOSFETs (Metal-Oxide-Semiconductor Field Effect Transistor). The zener diode 14 and the zener diode 15 are connected in series.

The voltage adjusting circuit 30A includes a latch circuit 3, switch circuit 4a-4c, FETs 5a-5c, FETs 6a-6c. Additionally, to easily understand, in FIG. 1 switch circuit and FETs only indicate three lines, however, in the normal situation there are N lines. Furthermore, These FETs are N type MOSFETs.

Moreover, in the storage unit array 23, most of the storage unit array 23 are storage unit 23a commonly used in data storage, and the rest of the storage unit array 23 are voltage modifying storage unit 23b. To restrain the area of the circuit, the voltage modifying storage unit 23b can flexibly utilize empty space in the storage unit array 23 commonly used in data storage, but can be an independent memory or storage portion.

The testing solder pad is used to test whether the voltage level of various output voltage from the high voltage generating circuit used in the semiconductor storage device is the same as a predetermined value and whether the voltage level can perform the basic writing or erasing operation. To proceed the voltage test on die stage, a plurality of solder pads are mounted to connect external terminal. The test of the testing pad is executed through the high voltage input/output circuit 1.

Figure 8:
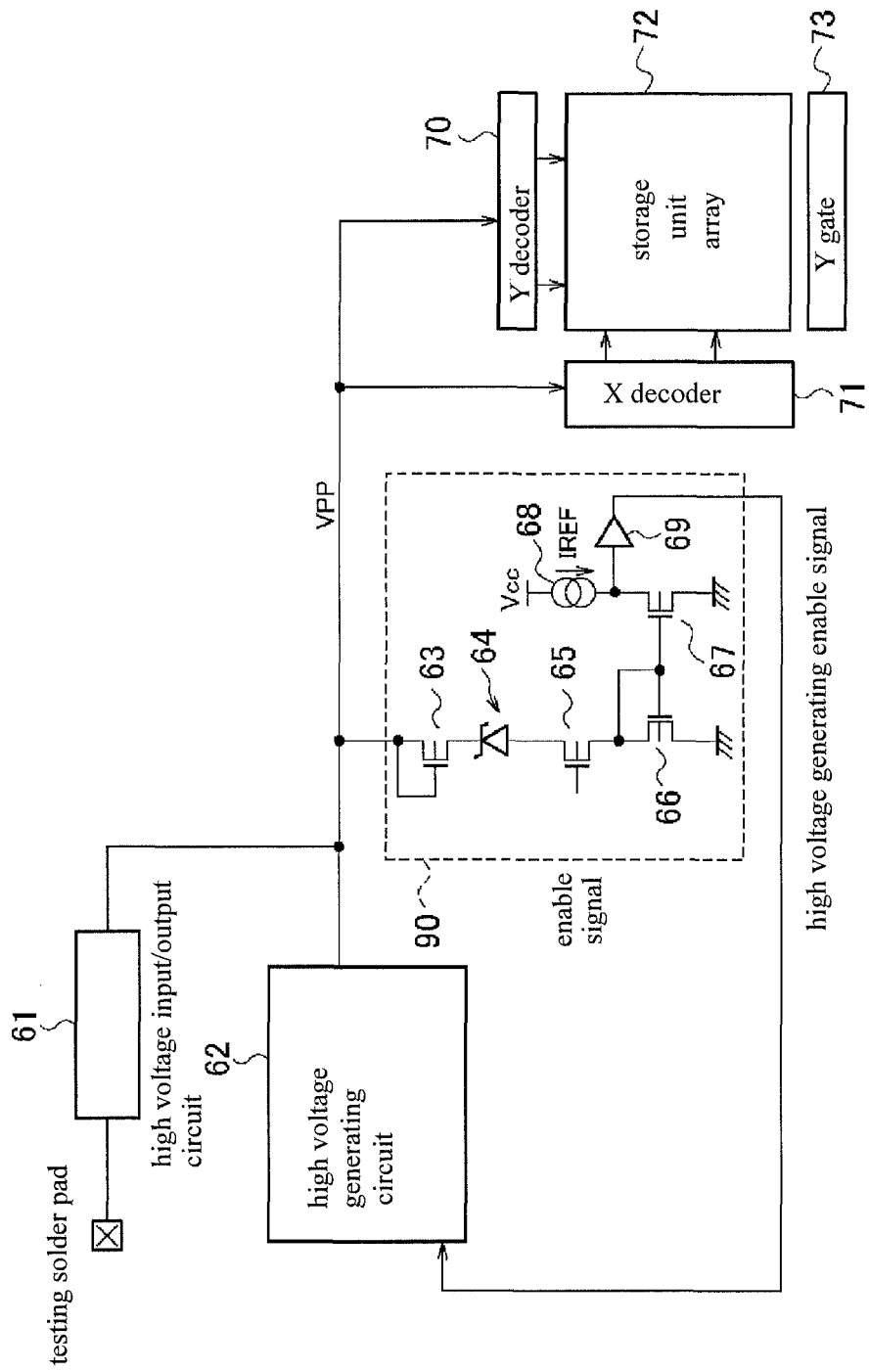
FIG. 8 is a block diagram showing a conventional semiconductor storage device.

The difference between the conventional FIG. 8 and the invention is that the voltage adjusting circuit 30A is mounted in the invention, the output signal of the sense amplifier circuit 24 is input to the high voltage regulator circuit 30 and the voltage modifying storage unit 23b is mounted in the storage unit array 23.

Firstly, in FIG. 1, the tester is used to test the high voltage VPP in the semiconductor storage device by the testing solder pad. Then, the trimming data (representing the data to turn on the switch of the switch circuit 4a-4c) determined by the difference between the tested high voltage VPP and a rated high voltage VPN is written into the voltage modifying storage unit 23b. One embodiment of the voltage modifying data is shown in FIG. 6.

Figures 6, 7:
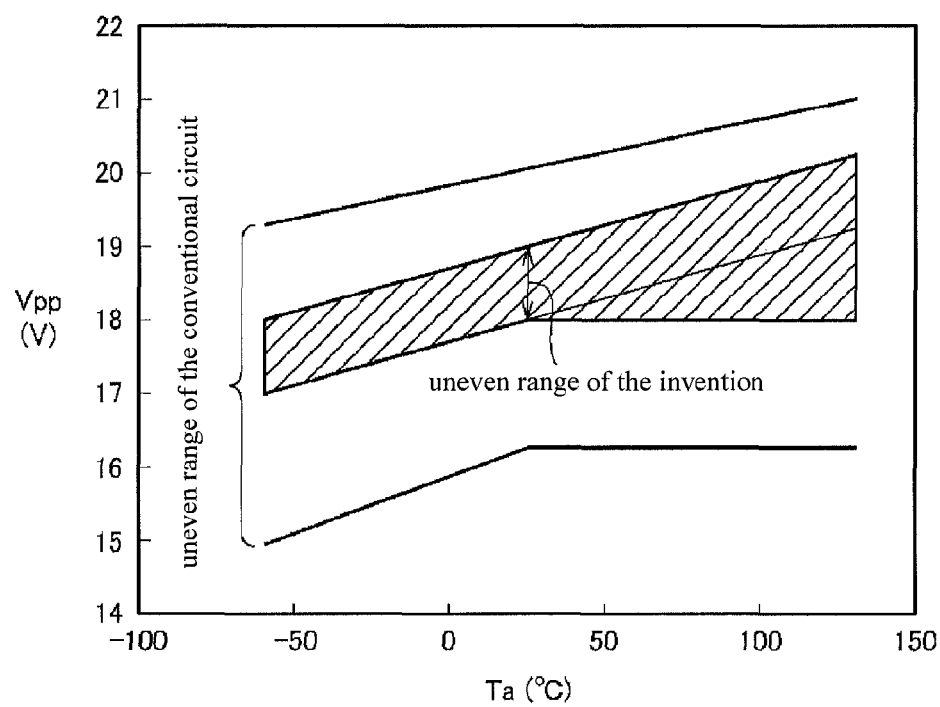
FIG. 6 shows voltage modifying data written in voltage modifying storage unit.
FIG. 7 is a diagram showing an uneven VPP comparison between the semiconductor storage device of the present invention and the conventional device.

The left column in FIG. 6 shows the tested high voltage VPP, and the right column in FIG. 6 shows the voltage modifying data written into the voltage modifying storage unit 23b in hexadecimal format. When the tested high voltage VPP is between 16.60 V-16.95 V, the voltage modifying data is 80; when the tested high voltage VPP is between 16.95 V-17.55 V, the voltage modifying data is 20; when the tested high voltage VPP is between 17.55 V-17.65 V, the voltage modifying data is C0; when the tested high voltage VPP is between 17.65 V-18.30 V, the voltage modifying data is A0; when the tested high voltage VPP is between 18.30 V-19.00 V, the voltage modifying data is E0.

Figure 4:
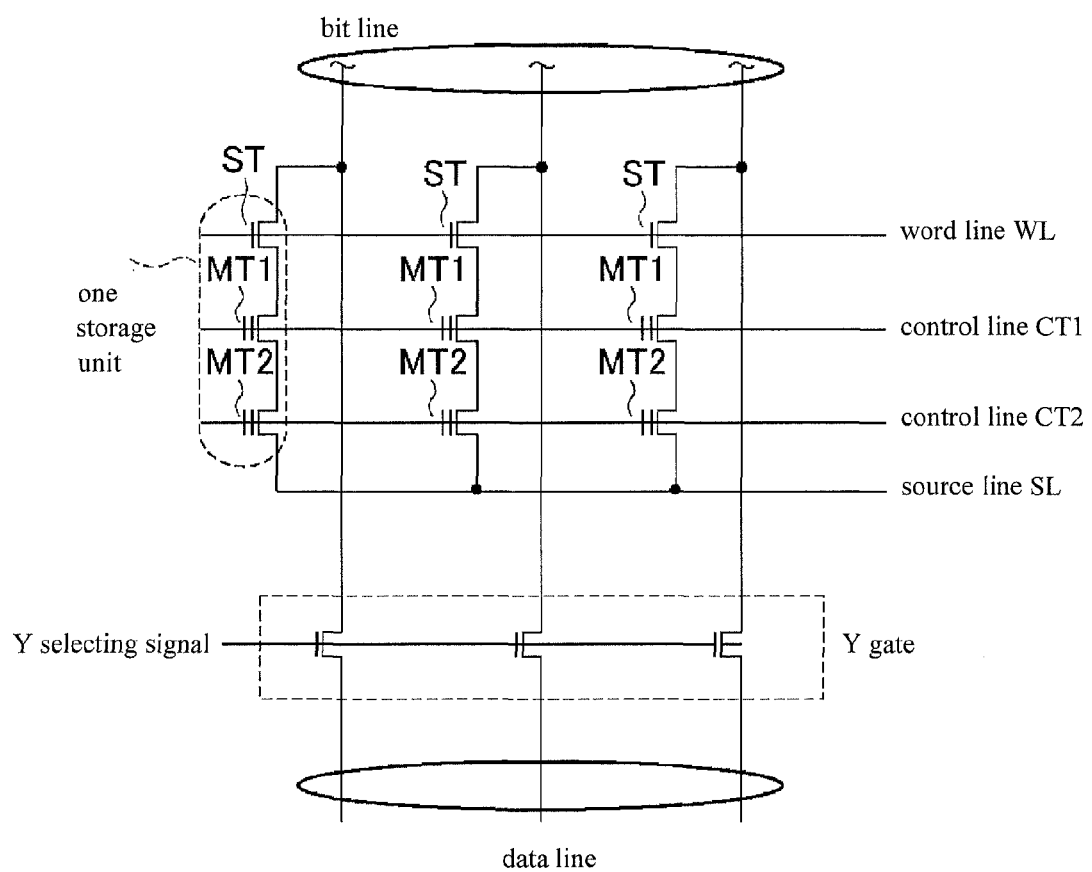
FIG. 4 is a diagram showing a storage unit array of the semiconductor storage device according to an embodiment of the present invention.

The configuration of B area in FIG. 1 is shown in FIG. 4. FIG. 4 shows a portion of the voltage modifying storage unit 23b, and since the voltage modifying storage unit 23b is one portion of the storage unit array 23, the whole illustration of the storage unit is described together. The storage unit array 23 includes in word lines (WL), control line CT1, control line CT2, source line SL and n bit lines (BL). These control lines are connected to m×n storage units (m and n are arbitrary integrals), each storage unit includes memory transistors MT1, MT2 and selecting transistor ST.

For example, the word line WL is connected to gates of the selecting transistors ST of the storage units, similarly to the other word lines. The control line CT1 is connected to control gates of memory transistors MT1 of the storage units. The control line CT2 is connected to control gates of memory transistors MT2 of the storage units.

The source line SL is connected to sources of the memory transistors MT2 connected to sources of the memory transistors MT1, similarly to the other source lines. The bit line BL is connected to drains of the selecting transistors ST of the storage units, similarly to the other bit lines. Additionally, in each storage unit, the source of the selecting transistor ST is connected to the drain of the memory transistor MT, thus one storage unit can store two bits data.

Firstly, before the data is written, the specific word line and control line are applied with high voltage, and the source line and bit line are applied with grounding voltage (0V).

Therefore, the specific storage unit becomes the following status: the gate of the selecting transistor ST and the control gate of the memory transistor MT1 or MT2 are applied with high voltage, and the drain of the selecting transistor ST and the source of the memory transistor MT1 or MT2 are applied with grounding voltage. Meanwhile, data "1" is written into the memory transistor MT1 or MT2. As mentioned in the above, by erasing the existing data in advance, the data can be rewritten into the storage unit.

If the erasing operation is ended, the writing operation starts. When data "0" is written into the specific storage unit, the word line and bit line are applied with high voltage, and the control line CT1 or CT2 is applied with grounding voltage, the source line SL is set to be open.

Therefore, the specific storage unit becomes the following status: the gate and the drain of the selecting transistor ST are applied with high voltage, and the control gate of the memory transistor MT1 or MT2 is applied with grounding voltage, on the other hand, the source of the memory transistor MT1 or MT2 becomes open. Meanwhile, data "0" is written into the memory transistor MT1 or MT2.

Figure 5:
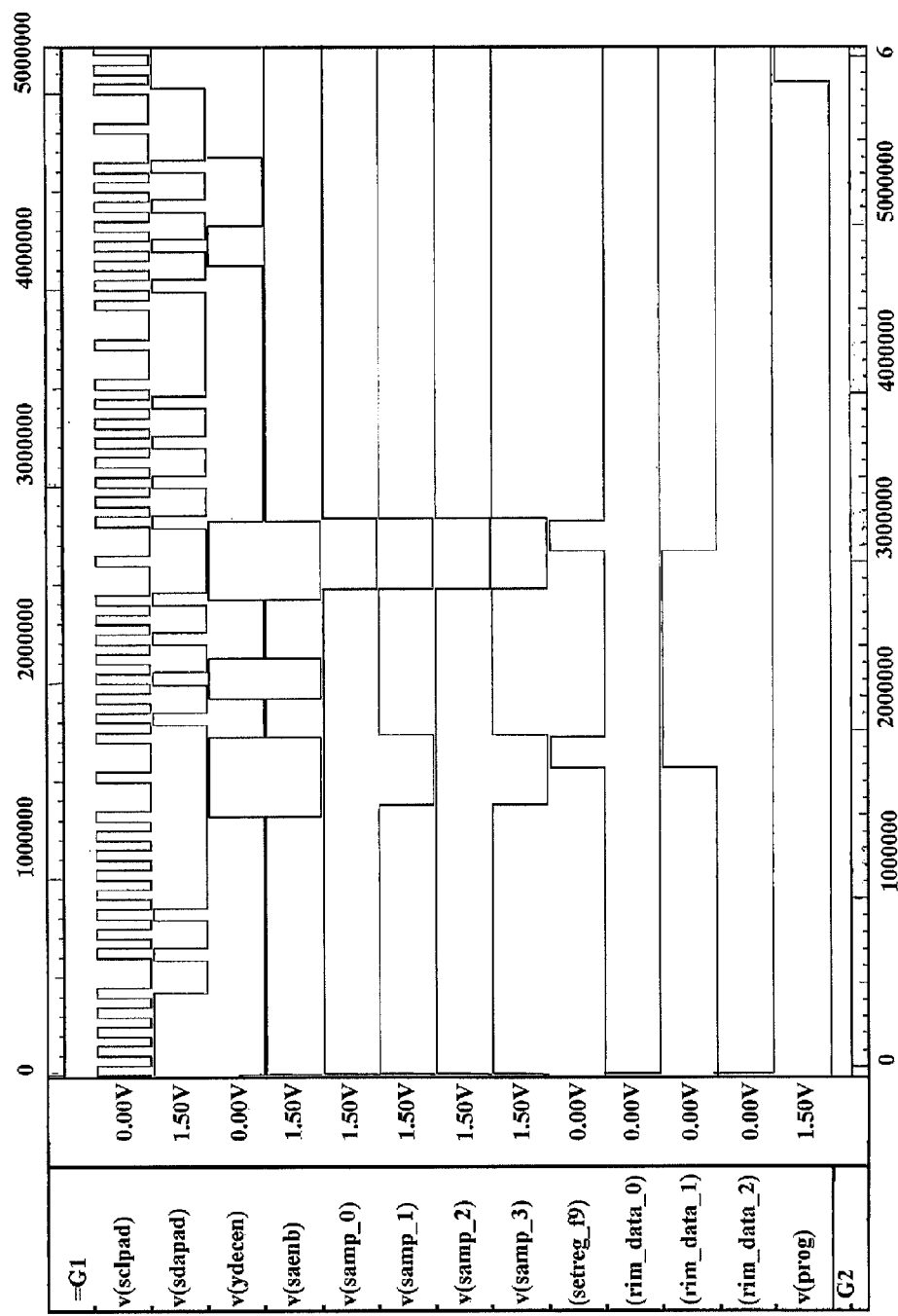
FIG. 5 is a timing diagram of the semiconductor storage device according to an embodiment of the present invention.

The operation of the semiconductor storage device is described as follows. FIG. 5 shows timing diagram of each portion of the semiconductor storage device. In FIG. 5, form the top the signals: "uesclpad," "sdapad," "ydecen," and "saenb" represent clock signal, input/output signal, Y selecting signal of Y gate circuit 25 and enable signal of the sense amplifier circuit 24 respectively, then the signals: "samp0," "samp1," "samp2" and "samp3" represent output signals of the sense amplifier circuit 24. Next, the signal "setreg" represents latch setting signal of the latch circuit 3, then the signals: "data0," "data1," "data2" and "data3" represent output signals of the latch circuit 3. Lastly, the signal "prog" represents starting to write into the storage unit.

When the storage unit 23 is erased/written, the high voltage needed for the erasing/writing operation is generated by using the signal from a control circuit (not shown in the drawings) to make the high voltage generating circuit 2 operate.

Meanwhile, in order to modify the withstand voltage of the zener diode of the high voltage regulator circuit 30, the sense amplifier circuit 24 is used to read data of the voltage modifying storage unit 23b to make the voltage adjusting circuit 30A operate.

When the storage unit array 23 executes writing command, the sense amplifier circuit 24 is used to read data of the voltage modifying storage unit 23b. When the Y selecting signal of the Y gate circuit 25 ascends and the enable signal of the sense amplifier circuit 24 descends, the voltage modifying storage unit 23b begins to be read.

At the starting reading time of the voltage modifying storage unit 23b, the semiconductor storage device 24 reads four bits voltage modifying data, and outputs the data. During the period of outputting the data from the sense amplifier circuit 24, the latch circuit 3 is used to latch the data by the latch setting signal.

Figure 2:
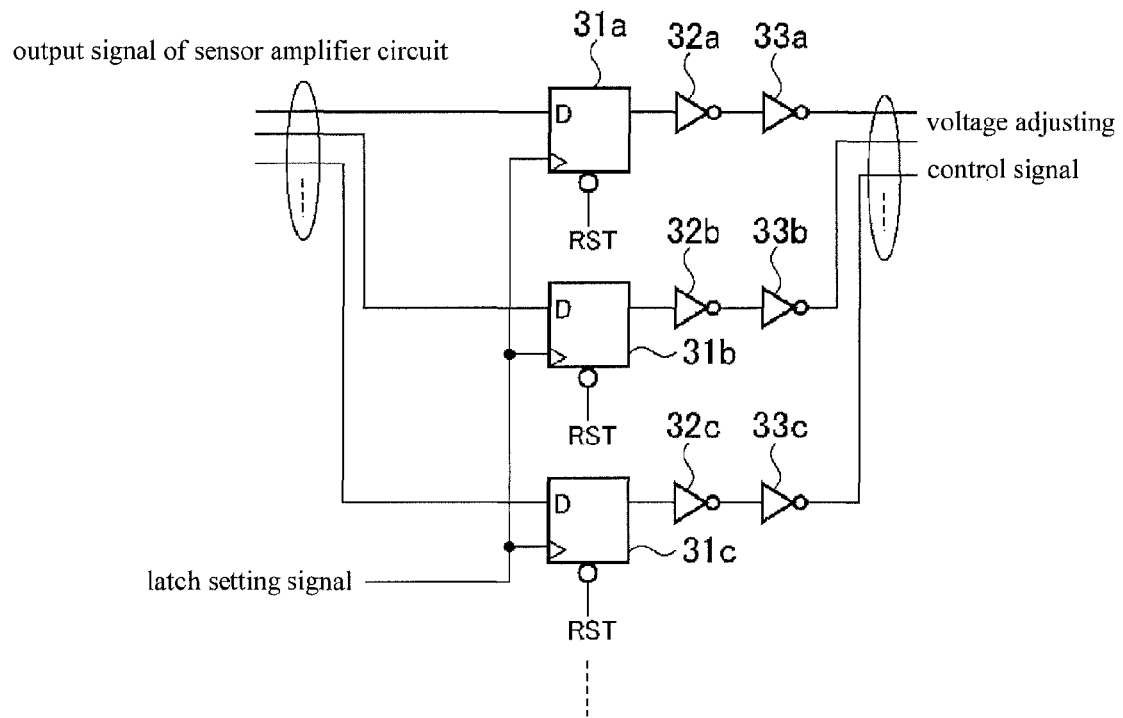
FIG. 2 is a diagram showing a latch circuit of the semiconductor storage device according to an embodiment of the present invention.

The circuit embodiment of the latch circuit 3 is shown in FIG. 2. In the situation of writing the voltage modifying data as shown in FIG. 6, the output signal of the sense amplifier circuit 24 needs at least four lines. Thus, the number of the signal lines of the circuit in FIG. 2 is four, and the D trigger and the invertor are four lines configuration.

For the circuit in FIG. 2, taking one line as an example, the output signal of the sense amplifier circuit 24 is input. When the output signal on the top line is high voltage level, it and the latch setting signal are maintained synchronously in the D trigger 31a, and the output of the D trigger 31a becomes high voltage level. The high voltage level signal passes through the invertor 32a and the invertor 33a, finally the voltage adjusting control signal being high voltage level is output. Similarly, the other lines operate as mentioned in the above.

Then, the maintained data in the latch circuit 3 is output to transmit control signal to switch circuit 4a-4c.

The switch circuits 4a-4c are described as follows. As mentioned in the above, in the situation that the output signals of the sense amplifier circuit 24 are four lines, it is necessary to add a switch circuit and a FET connected to the switch circuit.

Figure 3:
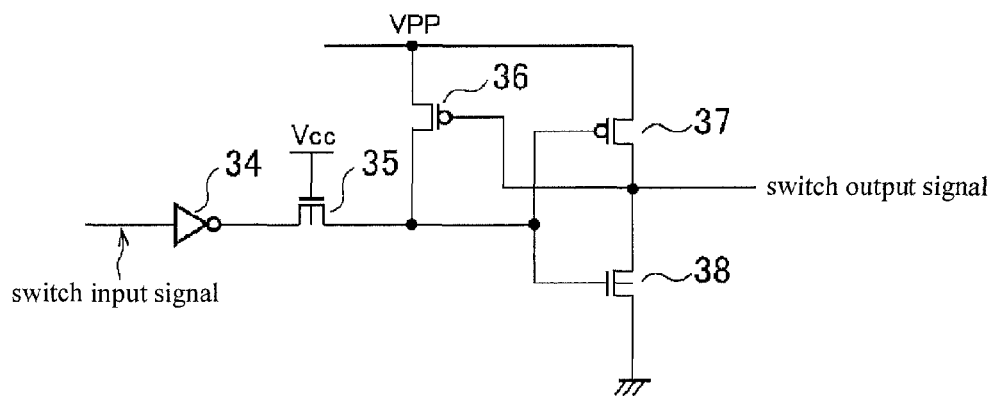
FIG. 3 is a diagram showing a switch circuit of the semiconductor storage device according to an embodiment of the present invention.

One circuit embodiment of the switch circuit is shown in FIG. 3. FETs 35 and 38 are N type MOSFETs, and FETs 36 and 37 are P type MOSFETs. When the switch input signal (the voltage adjusting control signal) output from the latch circuit 3 is high voltage level, the output of the invertor 34 is low voltage level, thus FET 35 turns on and the connection point of the FET 35 and FET 36 is low voltage level. Therefore, PET 38 turns off, and FET 37 turns on. Moreover, FET 36 turns off. Accordingly, the switch output signal is high voltage level.

Then, the switch output signal of the switch circuit 4a is input to FET 5a. The high voltage level of the switch output signal from the switch circuit 4a makes FET 5a turn on and make FET 6a (shorting the gate and the drain) turn off. On the other hand, the low voltage level of the switch output signal from the switch circuit 4a makes PET 5a turn off and make FET 6a turn on. Since FET 6a is a N type MOSFET source follower, the source voltage of FET 6a keeps on the value of subtracting the threshold value from the gate voltage when FET 6a turns on, similarly to the other line of FET 5b, FET 6b or FET 5c, FET 6c.

As mentioned in the above, the FETs 6a, 6b, 6c are selected to have the same threshold voltage so as to adjust the potential of the anode of the zener diode 15 according to the uneven withstand voltage of the zener diodes 14 and 15. That is, if the difference (VPN−VPP) between the tested high voltage VPP and the rated high voltage VPN is equal to the sum of three threshold voltages of FETs 6a, 6b, 6c, in the manner of turning off all FETs 6a, 6b, 6c the voltage modifying data is written into the voltage modifying storage unit 23b. Additionally, if the difference (VPN−VPP) is equal to the value of one threshold voltage among FETs 6a, 6b, 6c, in the manner of turning off any two of FETs 6a, 6b, 6c the voltage modifying data is written into the voltage modifying storage unit 23b.

As mentioned in the above, the threshold voltage of multiple N type MOSFETs connected in series is used as the bias voltage of the zener diodes 14, 15. That is, the uneven withstand voltage of the zener diodes 14 and 15 is modified by adjusting the potential of the anode of the zener diode.

Moreover, when the combination of the threshold voltages of the above FETs 6a, 6b, 6c can not modify the deviation of the high voltage, the MOSFETs with various threshold voltage can be used or be combined to modify.

As mentioned in the above, after the voltage adjusting circuit 30A adjusts the potential of the anode of the zener diode 15, the EN (enable) signal is input to the gate of the FET 7. If the high voltage VPP changes and is higher than the rated voltage, the zener diodes 14 and 15 turn on, and the current flows through zener diodes 14, 15, FETs 6a-6c, FET 8. Then, the next operation is the same as the operation in FIG. 8, and the description is omitted.

Furthermore, in FIG. 1, the voltage adjusting circuit 30A is connected to the anode of the zener diode 15 so as to adjust the potential of the anode of the zener diode. However, the voltage adjusting circuit 30A can be connected to the cathode of the zener diode 14 so as to adjust the potential of the cathode of the zener diode 14. If the voltage adjusting circuit 30A is connected to the cathode of the zener diode 14, the voltage descent of any of FETs 6a, 6b, 6c becomes large so as to increase the potential adjusting level of the cathode of the zener diode 14.

On the other hand, in FIG. 1, the zener is used as the voltage setting element. However, the resistor can replace the zener diode, and the transistor can be used as the voltage setting element. When the transistor is used, the gate and the drain of the transistor can be connected to have the characteristic of a diode, and the drain can be connected to the VPP line.

FIG. 7 is a diagram showing an uneven VPP comparison between the semiconductor storage device of the present invention and the conventional semiconductor storage device in FIG. 8. For various semiconductor storage device with various combination of the zener diodes, many test are performed to gather the data. The Y-axis represents VPP (V), and X-axis represents temperature Ta (° C.), thus FIG. 7 also shows the uneven change caused by the change of the temperature characteristic of the zener diode.

In the conventional semiconductor storage device, because of the uneven withstand voltage of the zener diode, the uneven range of the tested high voltage VPP is large (15V-19V). In the semiconductor storage device of the invention, the uneven range of the tested high voltage VPP is within 1V, thus the change of the VPP is small.

As mentioned in the above, in the semiconductor storage device of the invention, according to the voltage modifying data stored in the storage unit, the high voltage is adjusted, thus the precision of the high voltage applied to the storage unit is increased. Additionally, compared with the conventional method of using laser repair to change the resistance so as to adjust the high voltage, the invention can directly use the storage unit or read-out circuit to adjust voltage so as to minimize the test step or the increased area of circuit.

Additionally, for the die with large voltage deviation, the disqualified die in the test before the goods is delivered can proceed the voltage modification so as to be within the tolerance interval, thus the disqualified die can be determined as a qualified die to increase the yield rate.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. All such modifications are intended to be within the scope of the claims appended hereto.

INDUSTRIAL APPLICABILITY

The semiconductor storage device of the present invention can be applied to semiconductor integrated circuit needed high voltage.

What is claimed is:

1. A semiconductor storage device, comprising:
   a high voltage generating circuit, for providing a high voltage to a memory;
   a high voltage regulator circuit, for maintaining the high voltage generated by the high voltage generating circuit to be a fixed voltage, and comprising a zener diode;
   a voltage adjusting circuit, for adjusting a potential of the zener diode and adjusting the high voltage provided to the memory, and
   a storage portion, for storing voltage modifying data provided to the voltage adjusting circuit,
   wherein the voltage adjusting circuit is used to adjust a potential of a cathode of the zener diode.

2. A semiconductor storage device, comprising:
   a high voltage generating circuit, for providing a high voltage to a memory;
   a high voltage regulator circuit, for maintaining the high voltage generated by the high voltage generating circuit to be a fixed voltage, and comprising a voltage setting element;
   a voltage adjusting circuit, for adjusting a potential of the voltage setting element and adjusting the high voltage provided to the memory, and
   a storage portion, for storing voltage modifying data provided to the voltage adjusting circuit,
   wherein the voltage adjusting circuit is used to adjust the potential of the voltage setting element by adjusting the threshold voltage of at least one second transistor connected to the voltage setting element.

3. The semiconductor storage device according to claim 2, wherein the voltage setting element is a zener diode.

4. The semiconductor storage device according to claim 3, wherein the voltage adjusting circuit is used to adjust a potential of an anode of the zener diode.

5. The semiconductor storage device according to claim 2, wherein the voltage setting element is a resistor.

6. The semiconductor storage device according to claim 2, wherein the voltage setting element is a first transistor connected with the characteristic of a diode.

7. The semiconductor storage device according to claim 2, wherein the storage portion is a portion of the memory.

8. The semiconductor storage device according to claim 2, wherein the voltage modifying data corresponds to a adjusting range for the potential of the voltage setting element and is written into the storage portion.

9. The semiconductor storage device according to claim 2, wherein a plurality of second transistors are connected in series, the potential of the voltage setting element is adjusted by a combination of turning on or turning off the second transistors.

10. The semiconductor storage device according to claim 2, wherein the second transistors have various threshold voltages.

11. The semiconductor storage device according to claim 9, wherein the second transistors have various threshold voltages.

12. A semiconductor storage device, comprising:
    a high voltage generating circuit, for providing a high voltage to a memory;
    a high voltage regulator circuit, for maintaining the high voltage generated by the high voltage generating circuit to be a fixed voltage, and comprising a voltage setting element;
    a voltage adjusting circuit, for adjusting a potential of the voltage setting element and adjusting the high voltage provided to the memory, and
    a storage portion, for storing voltage modifying data provided to the voltage adjusting circuit,
    wherein the voltage adjusting circuit comprises a latch circuit and at least one second transistor.

13. The semiconductor storage device according to claim 12, wherein the latch circuit latches data every time when the voltage modifying data is read from the storage portion.

14. The semiconductor storage device according to claim 12, wherein the voltage setting element is a zener diode.

15. The semiconductor storage device according to claim 14, wherein the voltage adjusting circuit is used to adjust a potential of an anode of the zener diode.

16. The semiconductor storage device according to claim 12, wherein the voltage setting element is a resistor.

17. The semiconductor storage device according to claim 12, wherein the voltage setting element is a first transistor connected with the characteristic of a diode.

18. The semiconductor storage device according to claim 12, wherein the storage portion is a portion of the memory.

19. The semiconductor storage device according to claim 12, wherein the voltage modifying data corresponds to a adjusting range for the potential of the voltage setting element and is written into the storage portion.

* * * * *